United States Patent
Yoon et al.

(12) 
(10) Patent No.: US 6,696,217 B2
(45) Date of Patent: Feb. 24, 2004

(54) PHOTOSENSITIVE MONOMER, PHOTOSENSITIVE POLYMER AND CHEMICALLY AMPLIFIED RESIST COMPOSITION COMPRISING LACTONE GROUP HAVING ACID-LABILE PROTECTING GROUP

(75) Inventors: Kwang-sub Yoon, Seoul (KR); Sang-gyun Woo, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 163 days.

(21) Appl. No.: 10/077,856

(22) Filed: Feb. 20, 2002

(65) Prior Publication Data

US 2002/0155379 A1 Oct. 24, 2002

(30) Foreign Application Priority Data

Feb. 22, 2001 (KR) .............................. 01-9001

(51) Int. Cl.[7] .......................... G03C 1/73; G03F 7/039; C07D 307/26; C07D 307/30; C08F 124/00
(52) U.S. Cl. .................... 430/270.1; 430/905; 430/907; 430/910; 430/914; 430/919; 430/920; 430/921; 430/925; 430/325; 430/326; 549/263; 549/265; 549/295; 549/323; 526/270
(58) Field of Search .................. 549/263, 265, 549/295, 323; 526/270; 430/270.1, 325, 326, 905, 907, 910, 914, 919, 920, 921, 925

(56) References Cited

U.S. PATENT DOCUMENTS 5,843,624 A 12/1998 Houlihan et al. ........... 430/296

FOREIGN PATENT DOCUMENTS

| JP | 9-33736 | * | 2/1997 |
| JP | 2000-26446 | | 1/2000 |
| JP | 2000026446 | | 1/2000 |

OTHER PUBLICATIONS

Derwent :1997–169424—English Abstract for JP 9–33736.*
Hanamoto et al. "Utility of Phosphonium–Substituted Ester Enolates as Synthetic Intermediates. A Novel Phasphine–Catalyzed [3,3] Rearrangement of Allylic Acrylates", Journal of Organic Chemistry, 1993, 58, p. 299–300.*

Ballini et al. "A New Synthesis of exo—Methylene Butyrolactones from Nitroalkanes", Synthesis 2001, No. 10 p. 1519–1522.*

Nozaki, et al. "A Novel Polymer for a 193–Nm Resist", J. Photopolymer Science & Technology, 9(3):509–522 (1996).

Shida, et al., "Advanced Materials for 193–nm Resists", J. Photopolymer Science & Technology, 13(4):601–606, (2000).

Yamachika, et al., "Improvement of Post–Exposure Delay Stability in Alicyclic ArF Excimer Photoresists", J. Photopolymer Science & Technology, 12(4):553–560, (1999).

Akiko Kotachi, et al. A Novel Polymer for a 193–nm Resist, 1996, 509–522.

Naomi Shida, et al. Advanced Materials for 193nm Resists, 2000, 601–606.

Yamachika et al. Improvement of Post–Exposure Delay Stability in Alicyclic Arf Excimer Photoresists, 1999, 553–559.

* cited by examiner

Primary Examiner—Janet Baxter
Assistant Examiner—Sin J. Lee
(74) Attorney, Agent, or Firm—Lee & Sterba, P.C.

(57) ABSTRACT

A photosensitive monomer including a methylene butyrolactone derivative represented by the following formula:

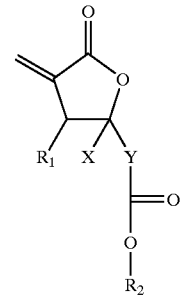

wherein $R_1$ is a hydrogen atom or alkyl group, $R_2$ is an acid-labile group, X is a hydrogen atom, or substituted or unsubstituted alkyl group having 1 to 10 carbon atoms, and Y is a substituted or unsubstitued alkyl group or alicyclic hydrocarbon group having 1 to 20 carbon atoms.

55 Claims, No Drawings

PHOTOSENSITIVE MONOMER, PHOTOSENSITIVE POLYMER AND CHEMICALLY AMPLIFIED RESIST COMPOSITION COMPRISING LACTONE GROUP HAVING ACID-LABILE PROTECTING GROUP

BACKGROUND OF THE INVENTION

1. Field of the Invention

The present invention relates to a chemically amplified resist composition and, more particularly, to a monomer having a lactone group, and a polymer and a resist composition prepared using the monomer.

2. Description of the Related Art

As manufacturing processes of semiconductor devices become more complicated and as integration density of semiconductor devices increases, the need to be able to form fine patterns also increases. As an example, in semiconductor memory devices having 1-Gigabit or more storage capacity, a pattern size having a design rule of 0.2 μm or less is needed. However, when a conventional photoresist material is exposed with a KrF excimer laser (248 nm wavelength), there is a limitation to forming such fine patterns. For this reason, a lithography technique using a new exposure light source, an ArF excimer laser (193 nm wavelength), has emerged.

Almost all well-known ArF resist compositions contain (meth)acryl-based polymers. Among these polymers, a methacrylate copolymer having an alicyclic protecting group, which is expressed by the formula below, has been suggested (*J. Photopolym. Sci. Technol.*, 9(3), pp. 509 (1996)).

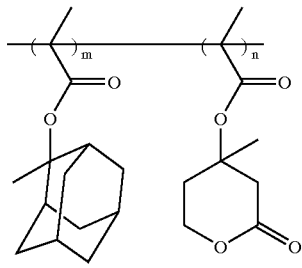

This polymer has an adamantyl group, which contributes to enhancing resistance to dry etching, and a lactone group, which improves adhesiveness, in its methacrylate backbone. As a result, the resolution of the resist and the depth of focus has improved. However, resistance to dry etching is still weak, and serious line edge roughness is observed after line patterns are formed from the resist layer.

Another drawback of the polymer having the formula shown above is that the raw material used to synthesis the polymer is expensive. In particular, the manufacturing cost of a polymer having a lactone group, which is introduced to improve adhesiveness, is so high that its practical use as a resist is difficult. Therefore, there is a need for a new polymer capable of replacing costly polymers for practical use.

As an example of another conventional resist composition, a cycloolefin-maleic anhydride (COMA) alternating polymer having the following formula has been suggested (*J. Photopolym. Sci. Technol.*, Vol. 12(4), pp. 553 (1999), and U.S. Pat. No. 5,843,624)

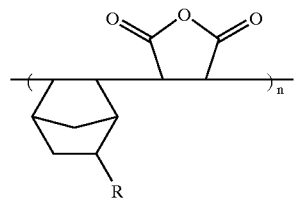

In the production of copolymer, such as a COMA alternating polymer having the formula shown above, the production cost of raw materials is cheap, whereas yield of the polymer sharply decreases. In addition, the transmittance of the polymer is very low at a short wavelength region, for example at 193 nm. The synthetic polymers have in their backbone the alicyclic group, which shows prominent hydrophobicity, and as a result, adhesiveness to neighboring material layers is very poor.

To improve the resolution of resist layer, the polymer system must be charged with a polar group. In recent years, a technique of introducing a lactone group into a methacrylate monomer having an alicyclic protecting group, using the following alicyclic compounds with lactone group, has been suggested so as to enhance the resistance to dry etching (*Journal of Photopolymer. Science of Technology*, Vol. 13, No. 4 (2000), pp. 601–606, and Japanese Patent Publication No. P2000-26446A):

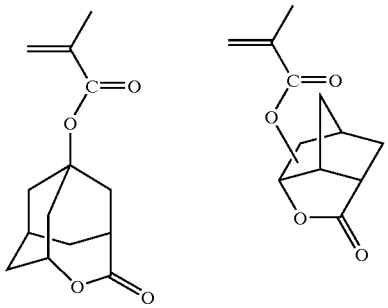

Unfortunately, yield of the monomer having the formula shown above is so low as to cause an increase in manufacturing cost.

SUMMARY OF THE INVENTION

A feature of an embodiment of the present invention is a photosensitive monomer comprising an adhesive lactone group having both a double bond capable of forming a polymer and a photosensitive group.

Another feature of an embodiment of the present invention is a photosensitive polymer having an adhesive lactone group in its backbone and comprising a photosensitive group.

Yet another feature of an embodiment of the present invention is to provide a resist composition that can be produced at low cost with improvements in terms of dry etching resistance, adhesiveness to underlying material layers, line edge roughness of line patterns, and contrast characteristic, which are essential to realize fine patterns.

In accordance with a first embodiment of the present invention, there is provided a photosensitive monomer including a methylene butyrolactone derivative represented by the following formula:

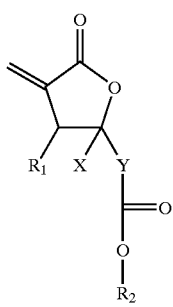

wherein $R_1$ is a hydrogen atom or alkyl group, $R_2$ is an acid-labile group, X is a hydrogen atom, or substituted or unsubstituted alkyl group having 1 to 10 carbon atoms, and Y is a substituted or unsubstitued alkyl group or alicyclic hydrocarbon group having 1 to 20 carbon atoms.

Preferably, $R_2$ is a t-butyl, a tetrahydropyranyl, or a substituted or unsubstituted alicyclic hydrocarbon group having 6 to 20 carbon atoms.

When $R_2$ is an alicyclic hydrocarbon group, $R_2$ may be 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

In the photosensitive monomer, Y is an alicyclic hydrocarbon group and represented by the following formula:

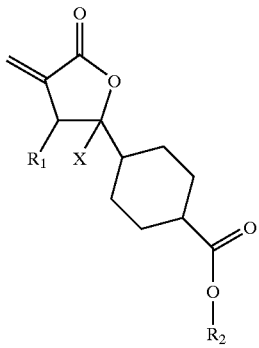

wherein $R_1$, $R_2$ and X are as defined above.

In another aspect of the first embodiment of the present invention, there is provided a photosensitive monomer comprising a methylene butyrolactone derivative represented by the following formula:

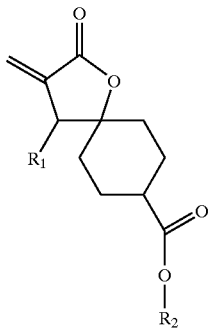

wherein $R_1$ is a hydrogen atom or alkyl group and $R_2$ is an acid-labile group.

In accordance with a second embodiment of the present invention featuring a photosensitive polymer having an adhesive lactone group in its backbone and comprising a photosensitive group, there is provided a photosensitive polymer having the following formula:

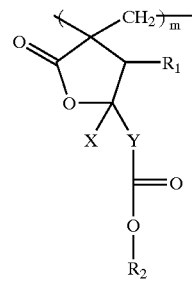

wherein $R_1$ is a hydrogen atom or alkyl group, $R_2$ is an acid-labile group, X is a hydrogen atom, or substituted or unsubstituted alkyl group having 1 to 10 carbon atoms, and Y is a substituted or unsubstitued alkyl group or alicyclic hydrocarbon group having 1 to 20 carbon atoms.

In accordance with another aspect of the second embodiment of the present invention, there is provided a photosensitive polymer having the following formula:

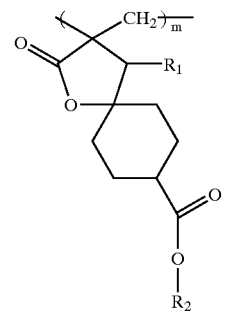

wherein $R_1$ and $R_2$ are as defined above.

In accordance with still another aspect of the second embodiment of the present invention, there is provided a photosensitive polymer including (a) a monomer unit represented by the following formula:

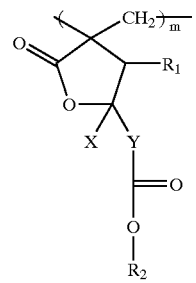

wherein $R_1$ is a hydrogen atom or alkyl group, $R_2$ is an acid-labile group, X is a hydrogen atom, or substituted or unsubstituted alkyl group having 1 to 10 carbon atoms, and Y is a substituted or unsubstitued alkyl group or alicyclic hydrocarbon group having 1 to 20 carbon atoms, and (b) at least one comonomer unit selected from the group consisting of an acrylate or methacrylate monomer unit, a maleic anhydride monomer unit and a norbornene monomer unit.

In the second embodiment of the present invention, the comonomer unit may include an acrylate or methacrylate monomer unit, and the photosensitive polymer has the following formula:

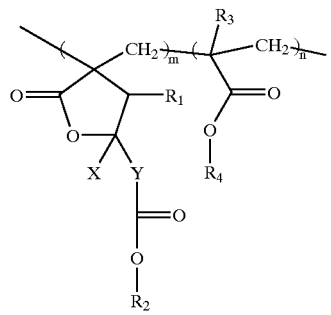

wherein $R_3$ is a hydrogen atom or methyl group, $R_4$ is an acid-labile group, $0<m<1$, $0<n<1$ and $m+n=1$. Also, $R_2$ and $R_4$ are preferably independently t-butyl, tetrahydropyranyl, or substituted or unsubstituted alicyclic hydrocarbon group having 6 to 20 carbon atoms. Alternatively, $R_2$ and $R_4$ are preferably independently 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

Moreover, in the second embodiment of the present invention, the comonomer unit may include a maleic anhydride monomer unit, and the photosensitive polymer has the following formula:

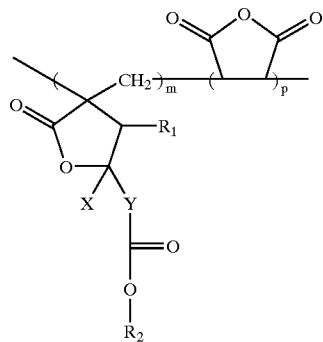

wherein $0<m<1$, $0<p<1$ and $m+p=1$.

Alternatively, the comonomer unit may include an acrylate or methacrylate monomer unit and a maleic anhydride monomer unit, and the photosensitive polymer has the following formula:

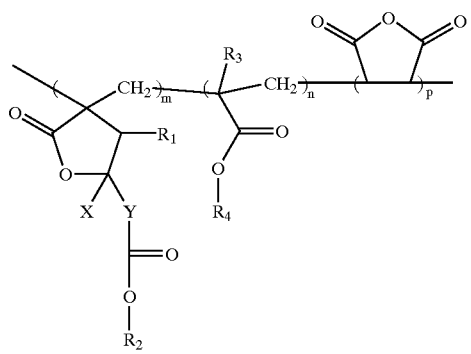

wherein $R_3$ is a hydrogen atom or methyl group, $R_4$ is an acid-labile group, $0<m<1$, $0<n<1$, $0<p<1$ and $m+n+p=1$.

Also, the comonomer unit may include a maleic anhydride monomer unit and a norbornene monomer unit, and the photosensitive polymer has the following formula:

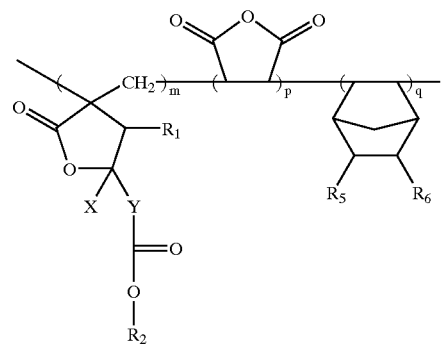

wherein $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having 6 to 20 carbon atoms, $0<m<1$, $0<p<1$, $0<q<1$ and $m+p+q=1$.

Further, the comonomer unit may include an acrylate or methacrylate monomer unit, a maleic anhydride monomer unit and a norbornene monomer unit, and the photosensitive polymer has the following formula:

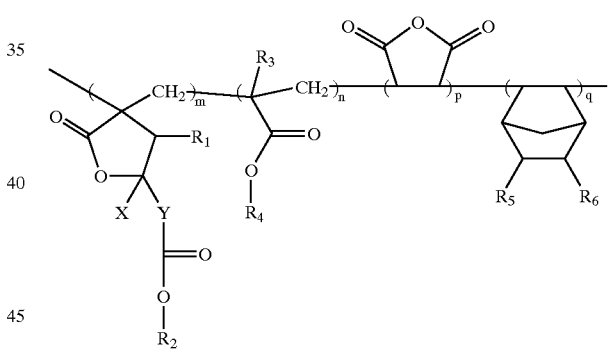

wherein $R_3$ is a hydrogen atom or methyl, $R_4$ is an acid-labile group, $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having 6 to 20 carbon atoms, $0<m<1$, $0<n<1$, $0<p<1$, $0<q<1$ and $m+n+p+q=1$.

In accordance with a third embodiment of the present invention featuring a resist composition that can be produced at low costs with improvements in terms of dry etching resistance, adhesiveness to underlying material layers, line edge roughness of line patterns, and contrast characteristics, which are essential to realize fine patterns, there is provided a resist composition including:

(a) a photosensitive polymer comprising a product of polymerization of:
 (a-1) a monomer unit represented by the following formula:

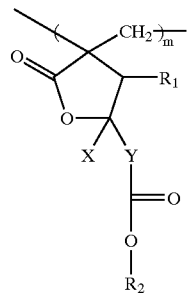

wherein $R_1$ is a hydrogen atom or alkyl group, $R_2$ is an acid-labile group, X is a hydrogen atom, or substituted or unsubstituted alkyl group having 1 to 10 carbon atoms, and Y is a substituted or unsubstituted alkyl group or alicyclic hydrocarbon group having 1 to 20 carbon atoms, and (a-2) at least one comonomer unit selected from the group consisting of an acrylate or methacrylate monomer unit, a maleic anhydride monomer unit and a norbornene monomer unit, and (b) a photoacid generator (PAG).

In the resist composition, the comonomer unit may include an acrylate or methacrylate monomer unit, and the photosensitive polymer has the following formula:

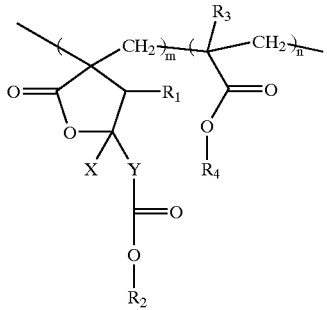

wherein $R_3$ is a hydrogen atom or methyl group, $R_4$ is an acid-labile group, $0<m<1$, $0<n<1$ and $m+n=1$.

Also, the comonomer unit may include a maleic anhydride monomer unit, and the photosensitive polymer has the following formula:

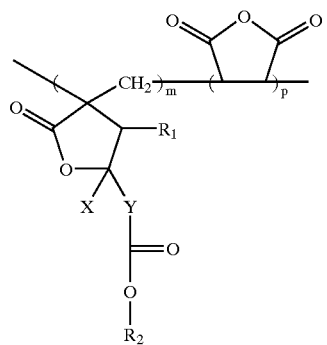

wherein $0<m<1$, $0<p<1$ and $m+p=1$.

Further, the comonomer unit may include an acrylate or methacrylate monomer unit and a maleic anhydride monomer unit, and the photosensitive polymer has the following formula:

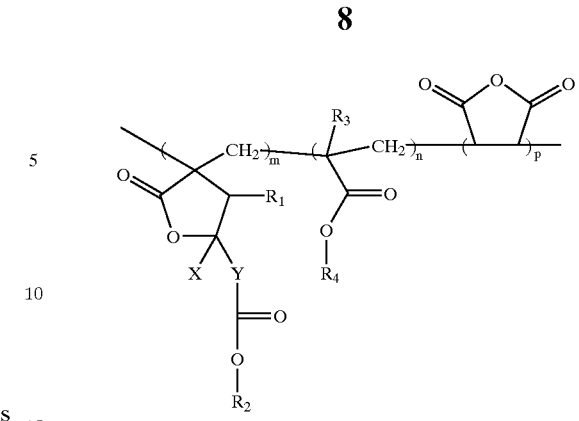

wherein $R_3$ is a hydrogen atom or methyl group, $R_4$ is an acid-labile group, $0<m<1$, $0<n<1$, $0<p<1$ and $m+n+p=1$.

Also, the comonomer unit preferably include a maleic anhydride monomer unit and a norbornene monomer unit, and the photosensitive polymer has the following formula:

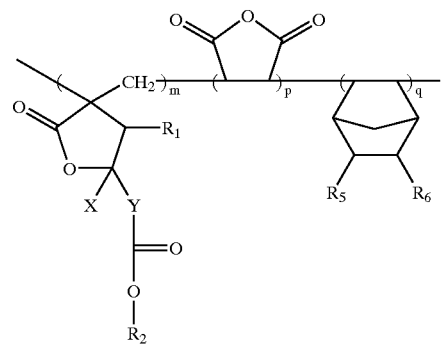

wherein $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having 6 to 20 carbon atoms, $0<m<1$, $0<p<1$, $0<q<1$ and $m+p+q=1$.

Further, the comonomer unit may include an acrylate or methacrylate monomer unit, a maleic anhydride monomer unit and a norbornene monomer unit, and the photosensitive polymer has the following formula:

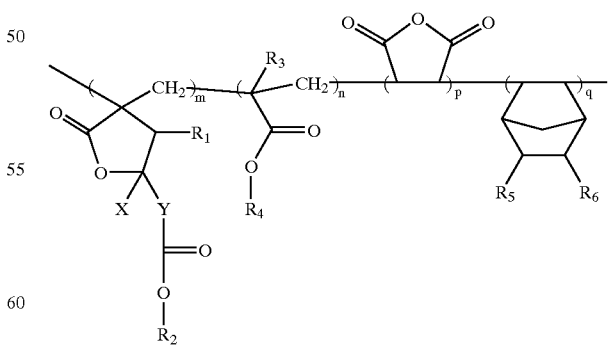

wherein $R_3$ is a hydrogen atom or methyl, $R_4$ is an acid-labile group, $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having 6 to 20 carbon atoms, 0<m<1, 0<n<1, 0<p<1, 0<q<1 and m+n+p+q=1.

In the resist composition, the photosensitive polymer preferably has a weight average molecular weight of 2,000 to 100,000.

The PAG is preferably contained in an amount of 1 to 15% by weight based on the weight of the photosensitive polymer. Preferably, the PAG includes triarylsulfonium salts, diaryliodonium salts, sulfonates or mixtures thereof. More preferably, the PAG includes triphenylsulfonium triflate, triphenylsulfonium antimonate, diphenylionium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, or mixtures of these compounds.

The resist composition may further include an organic base. The organic base is preferably contained in an amount of 0.01 to 2.0% by weight based on the weight of the photosensitive polymer. Also, the organic base may include a tertiary amine compound alone or a mixture of at least two tertiary amine compounds. Preferably, the organic base includes triethylamine, triisobutylamine, triisooctylamine, triisodecylamine, diethanolamine, triethanolamine or mixtures of these compounds.

The resist composition may further include a surfactant in an amount of 30 to 200 ppm.

Also, the resist composition may further include a dissolution inhibitor in an amount of 0.1 to 50% by weight based on the weight of the photosensitive polymer.

The photosensitive monomer according to the present invention includes a lactone group having both a double bond and a photosensitive group. The photosensitive polymer according to the present invention has a lactone group in its backbone and a photosensitive group. Thus, the resist composition prepared from the photosensitive polymer according to the present invention exhibits superior adhesiveness to underlying material layers, owing to the lactone group forming the backbone of the photosensitive polymer, and can improve dry etching resistance. Therefore, use of the resist composition according to the present invention in a photolithography process exhibits superior lithography performance, so that it can be very useful in the manufacture of next generation semiconductor devices.

These and other features and aspects of the present invention will be readily apparent to those of ordinary skill in the art upon review of the detailed description that follows.

DETAILED DESCRIPTION OF THE INVENTION

Korean Patent Application No. 01-9001, filed on Feb. 22, 2001, and entitled: "Photosensitive Monomer, Photosensitive Polymer and Chemically Amplified Resist Composition Comprising Lactone Group Having Acid-labile Protecting Group," is incorporated by reference herein in its entirety.

EXAMPLE 1
Synthesis of Monomers

Synthesis 1

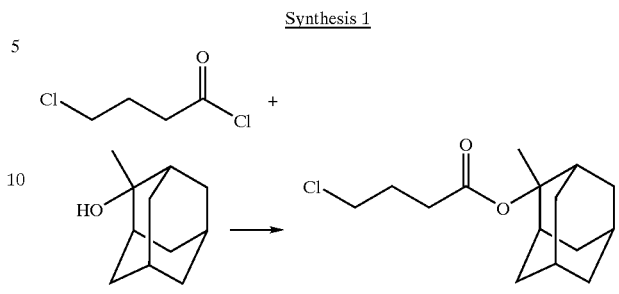

86 g of triethylamine was added dropwise to a solution prepared by dissolving 76 g of 2-methyl-2-adamantanol and 79 g of 4-chlorobutyryl chloride in 1 L of tetrahydrofurane (THF), and reacted at room temperature for 3 hours. The resultant product was poured into 2 L of ether, washed with 500 mL of water twice, and dried with anhydrous $Na_2SO_4$, followed by distillation of ether under reduced pressure. Finally, extraction by column chromatography was performed using ethyl acetate and hexane as solvents, yielding 58% of a desired product.

Synthesis 2

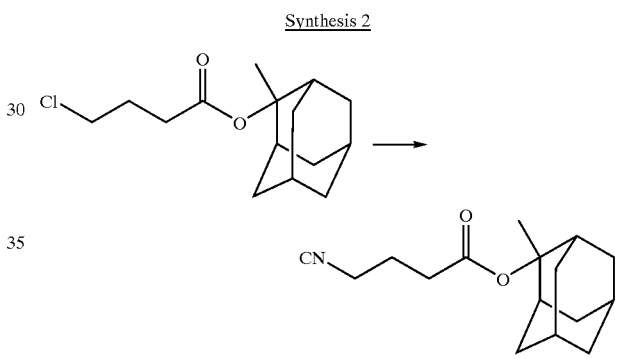

80 g of 2-methyl-2-adamantyl-4-chloro-1-butyrate and 46 g of KCN were dissolved in 500 mL of dimethylformamide (DMF) and then reacted at 60° C. for 12 hours. The resultant product was poured into 2 L of ether, washed with 500 mL of brine and with 500 mL of water, each twice, and dried with anhydrous $Na_2SO_4$, followed by distillation of ether under reduced pressure. Finally, separation by column chromatography was performed using ethyl acetate and hexane as solvents, yielding 76% of a desired product.

Synthesis 3

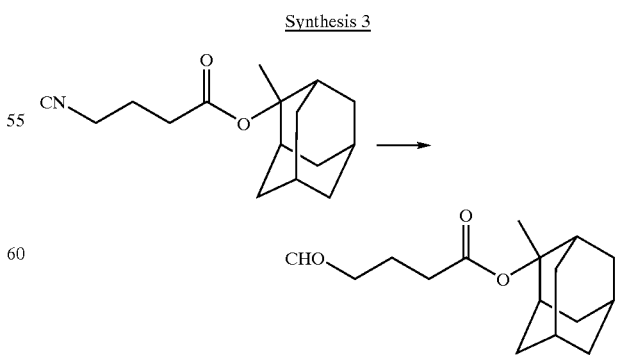

50 g of 2-methyl-2-adamantyl-4-cyano-1-butyrate was dissolved in 300 mL of toluene, 250 mL (1 M solution in toluene) was added dropwise thereto under nitrogen, and then reacted at room temperature for 12 hours. The resultant product was poured into 500 mL of 5% dilute chloric acid, followed by stirring at room temperature for 12 hours. The resultant product was extracted by 800 mL of ether, washed 300 mL of NaHCO$_3$ solution and 300 mL of water, and dried with anhydrous Na$_2$SO$_4$, followed by distillation of ether under reduced pressure. Finally, separation by column chromatography was performed using ethyl acetate and hexane as solvents, yielding 77% of a desired product.

Synthesis 4

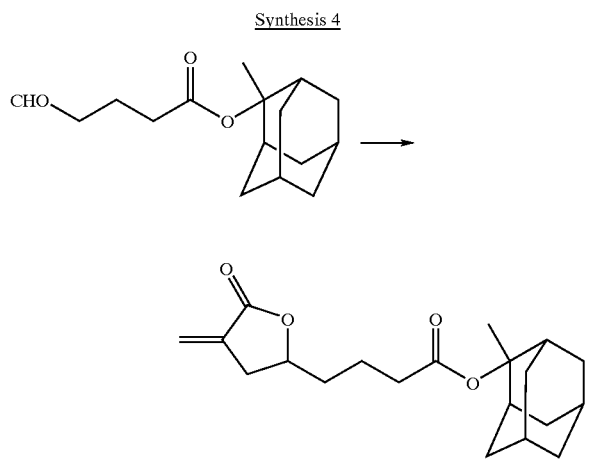

To 100 mL of dried THF was dissolved 27 g of ethyl-2-bromomethacrylate to prepare a first solution. To 40 mL of dried THF was added 9.2 g of zinc and 35 g of 2-methyl-2-adamantyl-5-oxo-1-pentanoate to prepare a second solution. Then, the first solution wad added dropwise to the second solution under nitrogen. The resultant product was reacted for 3 hours at a reaction temperature maintained at 60° C. The reaction product was cooled down to room temperature, poured into 400 mL of dilute chloric acid, and extracted twice with ether. The extracted solution was washed with 400 mL of NaHCO$_3$ solution and with 400 mL of water, and dried with anhydrous Na$_2$O$_4$, followed by distillation of ether under reduced pressure. Finally, separation by column chromatography was performed using ethyl acetate and hexane as solvents, yielding 51% of a desired product.

EXAMPLE 2

Synthesis or monomer

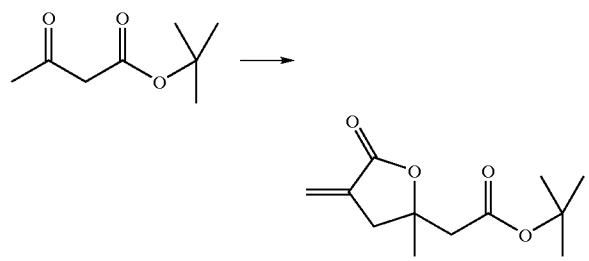

A desired product was synthesized in the same manner as in Synthesis 4 of Example 1, except that t-butyl acetoacetate was used instead of 2-methyl-2-adamantantyl-5-oxo-1-pentanoate (yield: 58%).

EXAMPLE 3

Synthesis of polymer

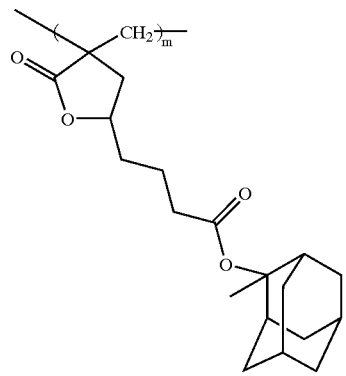

6.3 g of 2-methyl-2-adamantyl-4-(4-methylene-3-oxotetrahydro-2-furanyl)butyrate was dissolved in 6.3 g of THF, and 0.21 g of dimethyl 2,2'-azobisisobutyrate (V601) was added thereto, followed by degassing and polymerizing at 70° C. for 8 hours.

After the reaction was completed, the obtained reaction product was precipitated with excess isopropyl alcohol twice, filtered, and dried in a vacuum oven for 24 hours, so that the polymer having the formula above was obtained with a yield of 86%.

The obtained product had a weight average molecular weight (Mw) of 50,300, and a polydispersity (Mw/Mn) of 2.9.

EXAMPLE 4

Synthesis of copolymer

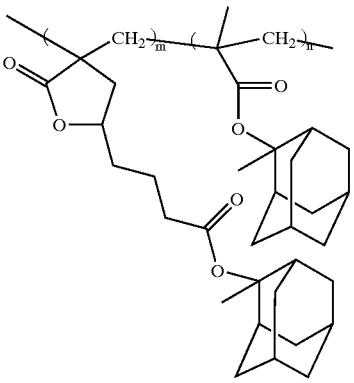

(m=0.5, n=0.5)

8 g of 2-methyl-2-adamantyl-4-(4-methylene-3-oxotetrahydro-2-furanyl)butyrate and 5.4 g of 2-methyl-2-adamantyl methacrylate were dissolved in 12.5 g of THF, and 0.6 g of dimethyl 2,2'-azobisisobutyrate (V601) was added thereto, followed by degassing and polymerizing at 70+ C. for 8 hours.

After the reaction was completed, the obtained reaction product was precipitated with excess isopropyl alcohol twice, filtered, and dried in a vacuum oven for 24 hours, so that the polymer having the formula above was obtained with a yield of 85%.

The obtained product had a weight average molecular weight (Mw) of 34,600, and a polydispersity (Mw/Mn) of 5.9.

EXAMPLE 5

Synthesis of copolymer

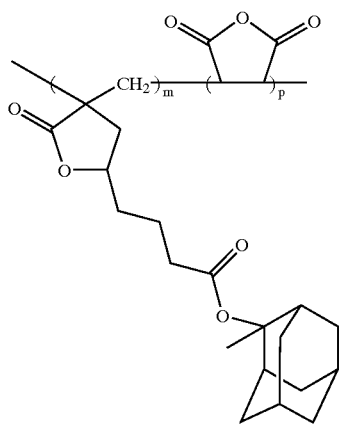

(m=0.5, n=0.5)

6.08 g of 2-methyl-2-adamantyl-4-(4-methylene-3-oxotetrahydro-2-furanyl)butyrate and 1.7 g of maleic anhydride were dissolved in 8 g of THF, and 0.4 g of dimethyl 2,2'-azobisisobutyrate (V601) was added thereto, followed by degassing and polymerizing at 70° C. for 8 hours.

After the reaction was completed, the obtained reaction product was precipitated with excess isopropyl alcohol twice, filtered, and dried in a vacuum oven for 24 hours, so that the copolymer having the formula above was obtained with a yield of 67%.

The obtained product had a weight average molecular weight (Mw) of 23,900, and a polydispersity (Mw/Mn) of 2.5.

EXAMPLE 6

Synthesis of terpolymer

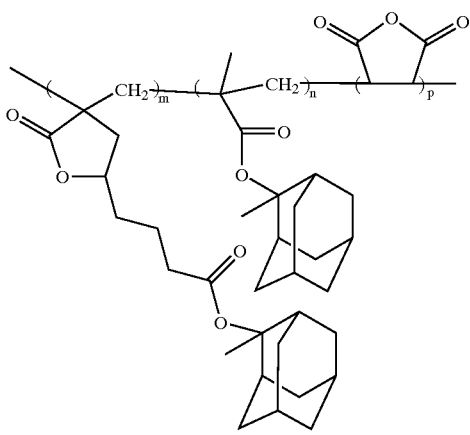

(m=0.25, n=0.25, p=0.5)

8 g of 2-methyl-2-adamantyl-4-(4-methylene-3-oxotetrahydro-2-furanyl)butyrate, 5.4 g of 2-methyl-2-adamantyl methacrylate and 5.2 g of maleic anhydride were dissolved in 18.6 g of THF, and 1.05 g of dimethyl 2,2'-azobisisobutyrate (V601) was added thereto, followed by degassing and polymerizing at 70° C. for 8 hours.

After the reaction was completed, the obtained reaction product was precipitated with excess isopropyl alcohol twice, filtered, and dried in a vacuum oven for 24 hours, so that the terpolymer having the formula above was obtained with a yield of 67%.

The obtained product had a weight average molecular weight (Mw) of 31,100, and a polydispersity (Mw/Mn) of 6.4.

EXAMPLE 7

Synthesis of terpolymer

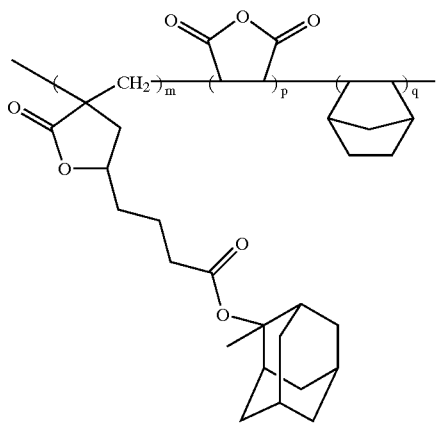

(m=0.375, n=0.375, p=0.25)

5.2 g of 2-methyl-2-adamantyl-4-(4-methylene-3-oxotetrahydro-2-furanyl)butyrate, 1.5 g of maleic anhydride and 0.94 g of norbornene were dissolved in 7.6 g of THF, and 0.46 g of dimethyl 2,2'-azobisisobutyrate (V601) was added thereto, followed by degassing and polymerizing at 70° C. for 8 hours.

After the reaction was completed, the obtained reaction product was precipitated with excess isopropyl alcohol twice, filtered, and dried in a vacuum oven for 24 hours, so that the terpolymer having the formula above was obtained with a yield of 76%.

The obtained product had a weight average molecular weight (Mw) of 13,700, and a polydispersity (Mw/Mn) of 4.4.

EXAMPLE 8

Synthesis of terpolymer

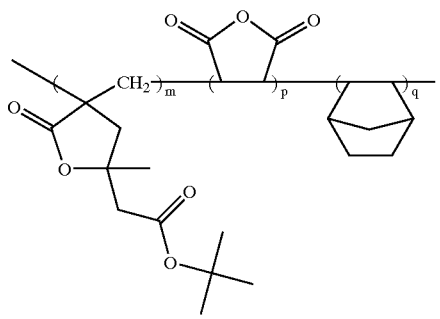

(m=0.429, n=0.429, p=0.143)

10 g of 5-butyl-1-(1-methyl-4-methylene-3-oxotetrahydro-2-furanyl) acetate, 4.0 g of maleic anhydride and 1.34 g of norbornene were dissolved in 16 g of THF, and 1.1 g of dimethyl 2,2'-azobisisobutyrate (V601) was added thereto, followed by degassing and polymerizing at 70° C. for 20 hours.

After the reaction was completed, the obtained reaction product was precipitated with excess isopropyl alcohol twice, filtered, and dried in a vacuum oven for 24 hours, so that the terpolymer having the formula above was obtained with a yield of 34%.

The obtained product had a weight average molecular weight (Mw) of 2,900, and a polydispersity (Mw/Mn) of 2.4.

The terpolymers were synthesized with various ratios of monomers and the results thereof are summarized in Table 1.

TABLE 1

| Mixture ratio of monomers (m:p:q) | Weight ratio of Solvent/ monomer | Content of initiator (mol %) | Polymerization time (hr) | Yield (%) | Mw | Mw/Mn |
|---|---|---|---|---|---|---|
| 0.429:0.429:0.143 | 1 | V601 0.05 | 20 | 34 | 2900 | 2.4 |
| 0.333:0.444:0.222 | 0.6 | V601 0.05 | 20 | 42 | 2700 | 2.3 |
| 0.3:0.5:0.2 | 0.6 | V601 0.05 | 20 | 50 | 2400 | 2.1 |

EXAMPLE 9

Synthesis of tetrapolymer

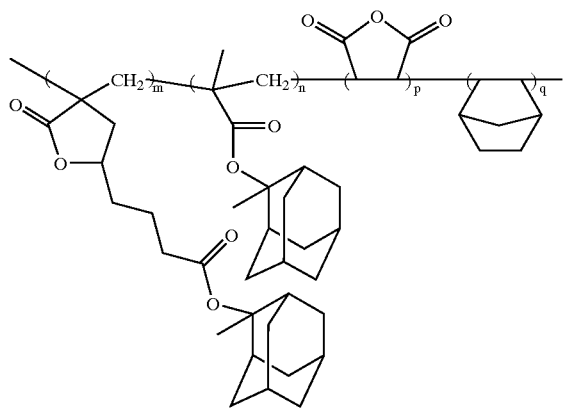

(m=0.2, n=0.2, p=0.4, q=0.2)

8 g of 2-methyl-2-adamantyl-4-(4-methylene-3-oxotetrahydro-2-furanyl) butyrate, 5.4 g of 2-methyl-2-adamantyl methacrylate, 5.2 g maleic anhydride and 2.3 g of norbornene were dissolved in 21 g of THF, and 1.3 g of dimethyl 2,2'-azobisisobutyrate (V601) was added thereto, followed by degassing and polymerizing at 70° C. for 8 hours.

After the reaction was completed, the obtained reaction product was precipitated with excess isopropyl alcohol twice, filtered, and dried in a vacuum oven for 24 hours, so that a tetrapolymer having the formula above was obtained with a yield of 75%.

The obtained product had a weight average molecular weight (Mw) of 24,400, and a polydispersity (Mw/Mn) of 4.9.

EXAMPLE 10

Preparation of Resist Composition 1.0 g of each of the polymers obtained in Examples 5–9, 0.01 g of triphenylsulfonium trifluoromethanesulfonate (triflate) as a photoacid generator (PAG), and 3.2 mg triisodecylamine as an organic base, were completely dissolved in a mixed solution of 4.0 g of propylene glycol monomethyl ether acetate (PGMEA) and 4.0 g of cyclohexanone, and filtered through a membrane filter of 0.2 microns, thereby obtaining resist compositions. Each of the resist compositions was coated on a silicon (Si) wafer treated with organic anti-reflective coating (ARC) to a thickness of about 0.35 microns.

The wafers coated with the respective resist compositions were soft baked at 120° C. for 90 seconds, exposed using an ArF excimer laser stepper (NA=0.6), and subjected to a post-exposure bake (PEB) at 120° C. for 60 seconds. The resultant wafers were developed using 2.38% by weight of tetramethylammonium hydroxide (TMAH) solution for about 60 seconds, thereby forming resist patterns. As a result, 0.2–0.3 micron line and space pattern of photoresist were formed with an exposure dosage of 10 to 30 mJ/cm$^2$.

The photosensitive polymer according to the present invention includes a lactone group having both a double bond capable of forming a polymer and a photosensitive group. The photosensitive polymer prepared from the photosensitive monomer has a lactone group in its backbone and a photosensitive group, which is quite different from the conventional acrylate structure or cycloolefin-maleic anhydride (COMA) alternative polymer. Thus, the resist composition prepared from the photosensitive polymer according to the present invention exhibits superior adhesiveness to underlying material layers, owing to the lactone group forming the backbone of the photosensitive polymer, and can improve dry etching resistance. Also, the resistance to dry etching can be improved by introducing an acid labile protection group contained in the photosensitive polymer, e.g., alicyclic hydrocarbon group. Further, the monomer according to the present invention includes a double bond having excellent reactivity for radical reaction, a high yield of polymers can be achieved.

As described above, the resist composition prepared from the lactone-based photosensitive polymer according to the present invention can provide superior adhesiveness to the underlying material layer and improved resistance to dry etching. Thus, use of the resist composition according to the present invention in a photolithography process exhibits superior lithography performance, so that it can be very useful in the manufacture of next generation semiconductor devices.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A photosensitive monomer comprising a methylene butyrolactone derivative represented by the following formula:

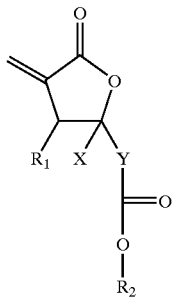

wherein $R_1$ is a hydrogen atom or alkyl group, $R_2$ is an acid-labile group, X is a hydrogen atom, or substituted or unsubstituted alkyl group having 1 to 10 carbon atoms, and Y is a substituted or unsubstitued alkyl group or alicyclic hydrocarbon group having 1 to 20 carbon atoms.

2. The photosensitive monomer according to claim 1, wherein $R_2$ is t-butyl, tetrahydropyranyl, or substituted or unsubstituted alicyclic hydrocarbon group having 6 to 20 carbon atoms.

3. The photosensitive monomer according to claim 2, wherein $R_2$ is 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[$5.2.1.0^{2,6}$]decanyl, 8-ethyl-8-tricyclo[$5.2.1.0^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

4. The photosensitive monomer according to claim 2, wherein Y is an alicyclic hydrocarbon group and represented by the following formula:

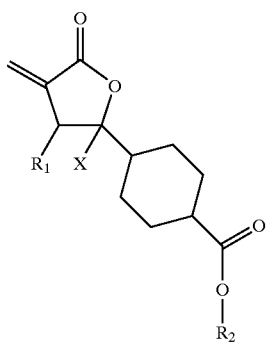

wherein $R_1$, $R_2$ and X are as defined.

5. A photosensitive monomer comprising a methylene butyrolactone derivative represented by the following formula:

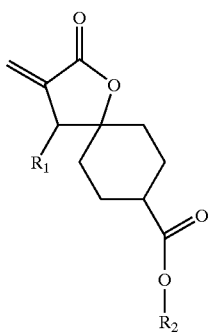

wherein $R_1$, is a hydrogen atom or alkyl group and $R_2$ is an acid-labile group.

6. The photosensitive monomer according to claim 5, wherein $R_2$ is t-butyl, tetrahydropyranyl, or substituted or unsubstituted alicyclic hydrocarbon group having 6 to 20 carbon atoms.

7. The photosensitive monomer according to claim 6, wherein $R_2$ is 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[$5.2.1.0^{2,6}$]decanyl, 8-ethyl-8-tricyclo[$5.2.1.0^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

8. A photosensitive polymer having the following formula:

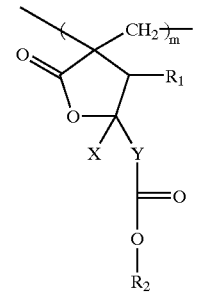

wherein $R_1$ is a hydrogen atom or alkyl group, $R_2$ is an acid-labile group, X is a hydrogen atom, or substituted or unsubstituted alkyl group having 1 to 10 carbon atoms, and Y is a substituted or unsubstitued alkyl group or alicyclic hydrocarbon group having 1 to 20 carbon atoms.

9. The photosensitive polymer according to claim 8, wherein $R_2$ is t-butyl, tetrahydropyranyl, or substituted or unsubstituted alicyclic hydrocarbon group having 6 to 20 carbon atoms.

10. The photosensitive polymer according to claim 9, wherein $R_2$ is 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[$5.2.1.0^{2,6}$]decanyl, 8-ethyl-8-tricyclo[$5.2.1.0^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

11. A photosensitive polymer having the following formula:

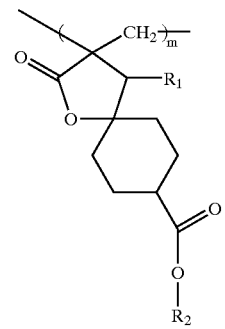

wherein $R_1$ is a hydrogen atom or alkyl and $R_2$ is an acid-labile group.

12. The photosensitive polymer according to claim 11, wherein $R_2$ is t-butyl, tetrahydropyranyl, or substituted or unsubstituted alicyclic hydrocarbon group having 6 to 20 carbon atoms.

13. The photosensitive polymer according to claim 12, wherein $R_2$ is 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

14. A photosensitive polymer comprising:
(a) a monomer unit represented by the following formula:

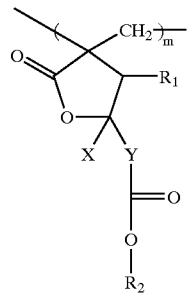

wherein $R_1$ is a hydrogen atom or alkyl group, $R_2$ is an acid-labile group, X is a hydrogen atom, or substituted or unsubstituted alkyl group having 1 to 10 carbon atoms, and Y is a substituted or unsubstitued alkyl group or alicyclic hydrocarbon group having 1 to 20 carbon atoms; and
(b) at least one comonomer unit selected from the group consisting of an acrylate or methacrylate monomer unit, a maleic anhydride monomer unit and a norbornene monomer unit.

15. The photosensitive polymer according to claim 14, wherein the comonomer unit includes an acrylate or methacrylate monomer unit, and the photosensitive polymer has the following formula:

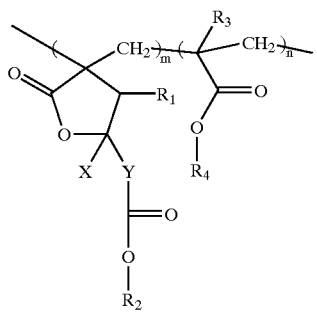

wherein $R_3$ is a hydrogen atom or methyl group, $R_4$ is an acid-labile group, $0<m<1$, $0<n<1$ and $m+n=1$.

16. The photosensitive polymer according to claim 15, wherein $R_2$ and $R_4$ are independently t-butyl, tetrahydropyranyl, or substituted or unsubstituted alicyclic hydrocarbon group having 6 to 20 carbon atoms.

17. The photosensitive polymer according to claim 16, wherein $R_2$ and $R_4$ are independently 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

18. The photosensitive polymer according to claim 14, wherein the comonomer unit includes a maleic anhydride monomer unit, and the photosensitive polymer has the following formula:

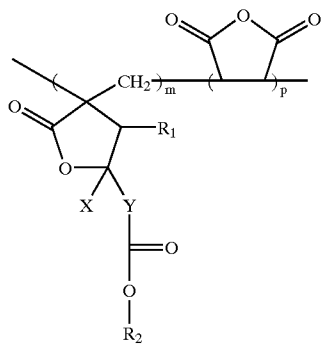

wherein $0<m<1$, $0<p<1$ and $m+p=1$.

19. The photosensitive polymer according to claim 18, wherein $R_2$ is t-butyl, tetrahydropyranyl, or substituted or unsubstituted alicyclic hydrocarbon group having 6 to 20 carbon atoms.

20. The photosensitive polymer according to claim 19, wherein $R_2$ is 1-methyl-1-cyclohexyl, 1-ethyl-1-cyclohexyl, 2-methyl-2-norbornyl, 2-methyl-2-isobornyl, 2-ethyl-2-norbornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

21. The photosensitive polymer according to claim 14, wherein the comonomer unit includes an acrylate or methacrylate monomer unit and a maleic anhydride monomer unit, and the photosensitive polymer has the following formula:

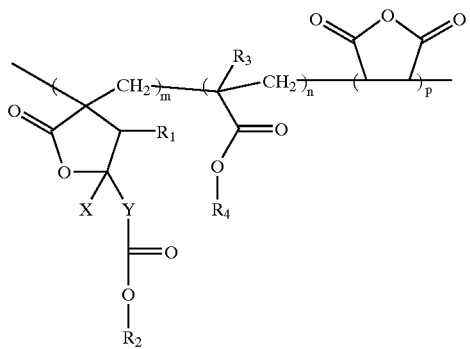

wherein $R_3$ is a hydrogen atom or methyl group, $R_4$ is an acid-labile group, $0<m<1$, $0<n<1$, $0<p<1$ and $m+n+p=1$.

22. The photosensitive polymer according to claim 21, wherein $R_2$ and $R_4$ are independently t-butyl, tetrahydropyranyl, or substituted or unsubstituted alicyclic hydrocarbon group having 6 to 20 carbon atoms.

23. The photosensitive polymer according to claim 22, wherein $R_2$ and $R_4$ are independently 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

24. The photosensitive polymer according to claim 14, wherein the comonomer unit includes a maleic anhydride monomer unit and a norbornene monomer unit, and the photosensitive polymer has the following formula:

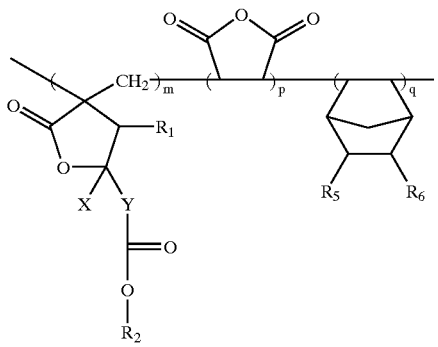

wherein $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having 6 to 20 carbon atoms, $0<m<1$, $0<p<1$, $0<q<1$ and $m+p+q=1$.

25. The photosensitive polymer according to claim 24, wherein $R_2$ is t-butyl, tetrahydropyranyl, or substituted or unsubstituted alicyclic hydrocarbon group having 6 to 20 carbon atoms.

26. The photosensitive polymer according to claim 25, wherein $R_2$ is 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

27. The photosensitive polymer according to claim 14, wherein the comonomer unit includes an acrylate or methacrylate monomer unit, a maleic anhydride monomer unit and a norbornene monomer unit, and the photosensitive polymer has the following formula:

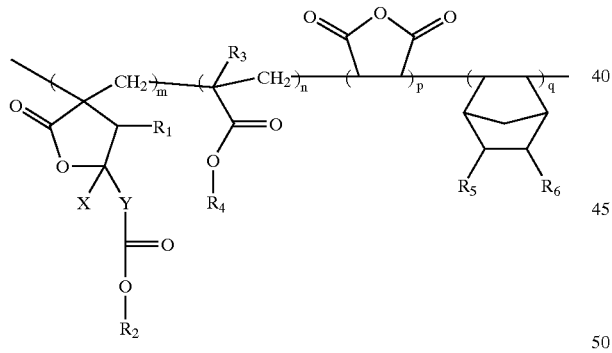

wherein $R_3$ is a hydrogen atom or methyl, $R_4$ is an acid-labile group, $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having 6 to 20 carbon atoms, $0<m<1$, $0<n<1$, $0<p<1$, $0<q<1$ and $m+n+p+q=1$.

28. The photosensitive polymer according to claim 27, wherein $R_2$ and $R_4$ are independently t-butyl, tetrahydropyranyl, or substituted or unsubstituted alicyclic hydrocarbon group having 6 to 20 carbon atoms.

29. The photosensitive polymer according to claim 28, wherein $R_2$ and $R_4$ are independently 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

30. A resist composition comprising:
   (a) a photosensitive polymer comprising a product of polymerization of
      (a-1) a monomer unit represented by the following formula:

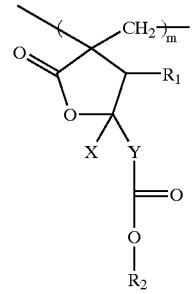

wherein $R_1$ is a hydrogen atom or alkyl group, $R_2$ is an acid-labile group, X is a hydrogen atom, or substituted or unsubstituted alkyl group having 1 to 10 carbon atoms, and Y is a substituted or unsubstitued alkyl group or alicyclic hydrocarbon group having 1 to 20 carbon atoms, and
      (a-2) at least one comonomer unit selected from the group consisting of an acrylate or methacrylate monomer unit, a maleic anhydride monomer unit and a norbornene monomer unit; and
   (b) a photoacid generator (PAG).

31. The resist composition according to claim 30, wherein the comonomer unit includes an acrylate or methacrylate monomer unit, and the photosensitive polymer has the following formula:

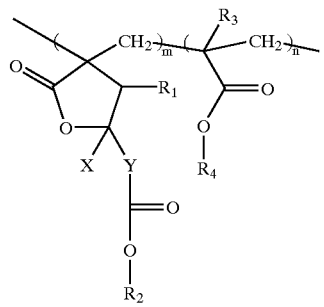

wherein $R_3$ is a hydrogen a tom or methyl group, $R_4$ is an acid-labile group, $0<m<1$, $0<n<1$ and $m+n=1$.

32. The resist composition according to claim 31, wherein $R_2$ and $R_4$ are independently t-butyl, tetrahydropyranyl, or substituted or unsubstituted alicyclic hydrocarbon group having 6 to 20 carbon atoms.

33. The resist composition according to claim 32, wherein $R_2$ and $R_4$ are independently 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

34. The resist composition according to claim 30, wherein the comonomer unit includes a maleic anhydride monomer unit, and the photosensitive polymer has the following formula:

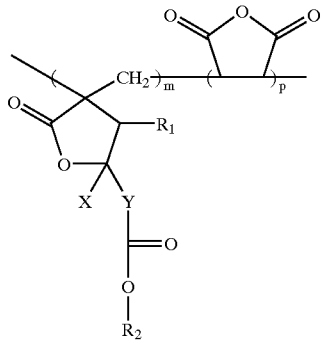

wherein 0<m<1, 0<p<1 and m+p=1.

35. The resist composition according to claim 34, wherein $R_2$ is t-butyl, tetrahydropyranyl, or substituted or unsubstituted alicyclic hydrocarbon group having 6 to 20 carbon atoms.

36. The resist composition according to claim 35, wherein $R_2$ is 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

37. The resist composition according to claim 30, wherein the comonomer unit includes an acrylate or methacrylate monomer unit and a maleic anhydride monomer unit, and the photosensitive polymer has the following formula:

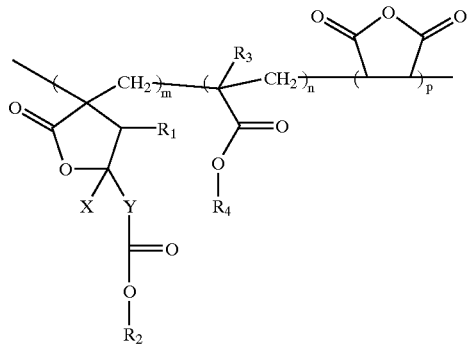

wherein $R_3$ is a hydrogen atom or methyl group, $R_4$ is an acid-labile group, 0<m<1, 0<n<1, 0<p<1 and m+n+p=1.

38. The resist composition according to claim 37, wherein $R_2$ and $R_4$ are independently t-butyl, tetrahydropyranyl, or substituted or unsubstituted alicyclic hydrocarbon group having 6 to 20 carbon atoms.

39. The resist composition according to claim 38, wherein $R_2$ and $R_4$ are independently 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

40. The resist composition according to claim 30, wherein the comonomer unit includes a maleic anhydride monomer unit and a norbornene monomer unit, and the photosensitive polymer has the following formula:

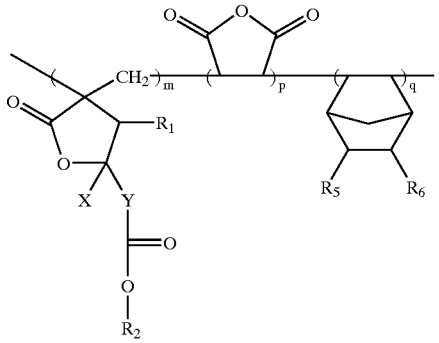

wherein $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having 6 to 20 carbon atoms, 0<m<1, 0<p<1, 0<q<1 and m+p+q=1.

41. The resist composition according to claim 40, wherein $R_2$ is t-butyl, tetrahydropyranyl, or substituted or unsubstituted alicyclic hydrocarbon group having 6 to 20 carbon atoms.

42. The resist composition according to claim 41, wherein $R_2$ is 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

43. The resist composition according to claim 30, wherein the comonomer unit includes an acrylate or methacrylate monomer unit, a maleic anhydride monomer unit and a norbornene monomer unit, and the photosensitive polymer has the following formula:

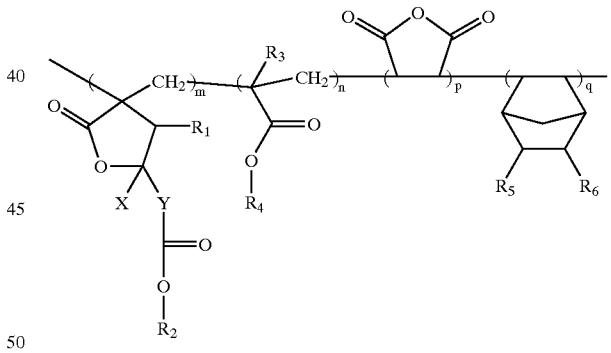

wherein $R_3$ is a hydrogen atom or methyl, $R_4$ is an acid-labile group, $R_5$ and $R_6$ are independently a hydrogen atom, hydroxyl, hydroxymethyl, 2-hydroxyethyloxycarbonyl, carboxyl, t-butoxycarbonyl, methoxycarbonyl, or substituted or unsubstituted alicyclic hydrocarbon having 6 to 20 carbon atoms, 0<m<1, 0<n<1, 0<p<1, 0<q<1 and m+n+p+q=1.

44. The resist composition according to claim 43, wherein $R_2$ and $R_4$ are independently t-butyl, tetrahydropyranyl, or substituted or unsubstituted alicyclic hydrocarbon group having 6 to 20 carbon atoms.

45. The resist composition according to claim 44, wherein $R_2$ and $R_4$ are independently 1-methyl-1-cyclohexyl, 1-ethyl-1-cyclohexyl, 2-methyl-2-norbornyl, 2-ethyl-2-norbornyl, 2-methyl-2-isobornyl, 2-ethyl-2-isobornyl, 8-methyl-8-tricyclo[5.2.1.0$^{2,6}$]decanyl, 8-ethyl-8-tricyclo

[5.2.1.0$^{2,6}$]decanyl, 2-methyl-2-adamantyl, 2-ethyl-2-adamantyl, 1-adamantyl-1-methylethyl, 2-methyl-2-fenchyl or 2-ethyl-2-fenchyl.

46. The resist composition of claim 30, wherein the photosensitive polymer has a weight average molecular weight of 2,000 to 100,000.

47. The resist composition of claim 30, wherein the PAG is contained in an amount of 1 to 15% by weight based on the weight of the photosensitive polymer.

48. The resist composition of claim 30, wherein the PAG comprises triarylsulfonium salts, diaryliodonium salts, sulfonates or mixtures thereof.

49. The resist composition of claim 30, wherein the PAG comprises triphenylsulfonium triflate, triphenylsulfonium antimonate, diphenylionium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, or mixtures of these compounds.

50. The resist composition of claim 30, further comprising an organic base.

51. The resist composition of claim 50, wherein the organic base is contained in an amount of 0.01 to 2.0% by weight based on the weight of the photosensitive polymer.

52. The resist composition of claim 51, wherein the organic base comprises triethylamine, triisobutylamine, triisooctylamine, triisodecylamine, diethanolamine, triethanolamine or mixtures of these compounds.

53. The resist composition of claim 50, wherein the organic base comprises a tertiary amine compound alone or a mixture of at least two tertiary amine compounds.

54. The resist composition of claim 30, further comprising a surfactant in an amount of 30 to 200 ppm.

55. The resist composition of claim 30, further comprising a dissolution inhibitor in an amount of 0.1 to 50% by weight based on the weight of the photosensitive polymer.

* * * * *